(12) United States Patent
Gustat

(10) Patent No.: US 7,924,196 B2
(45) Date of Patent: Apr. 12, 2011

(54) DIGITAL-ANALOG CONVERTER

(75) Inventor: Hans Gustat, Heidesee/OT Prieros (DE)

(73) Assignee: IHP GmbH Innovations for High Performance Microelectronics/Leibniz Institut for Innovative Mikroelektronik, Frankfurt (Oder) (DE)

( * ) Notice: Subject to any disclaimer, the term of this patent is extended or adjusted under 35 U.S.C. 154(b) by 0 days.

(21) Appl. No.: 12/587,105

(22) Filed: Sep. 30, 2009

(65) Prior Publication Data
US 2010/0141495 A1 Jun. 10, 2010

(30) Foreign Application Priority Data

Sep. 30, 2008 (DE) .......................... 10 2008 050 001

(51) Int. Cl.
*H03M 1/66* (2006.01)
(52) U.S. Cl. ......... 341/144; 341/133; 341/136; 341/153
(58) Field of Classification Search .................. 341/133, 341/134, 135, 136, 144, 153
See application file for complete search history.

(56) References Cited

U.S. PATENT DOCUMENTS

| | | | | |
|---|---|---|---|---|
| 4,663,610 A * | 5/1987 | Metz et al. | ...................... | 341/133 |
| 5,548,288 A | 8/1996 | Lueng | ............................. | 341/136 |
| 6,888,485 B2 * | 5/2005 | Splett et al. | ..................... | 341/144 |
| 6,967,609 B1 * | 11/2005 | Bicakci et al. | ................. | 341/144 |
| 7,071,858 B2 * | 7/2006 | Pan | ................................ | 341/133 |
| 7,129,871 B1 | 10/2006 | Venes et al. | .................... | 341/136 |
| 7,158,062 B2 * | 1/2007 | Cosand | .......................... | 341/143 |
| 7,256,720 B2 * | 8/2007 | Fukuda | ........................... | 341/143 |
| 7,292,172 B2 * | 11/2007 | Matsumoto et al. | .......... | 341/144 |
| 7,321,326 B2 * | 1/2008 | Imai | ................................ | 341/144 |
| 7,605,734 B2 * | 10/2009 | Bult et al. | ...................... | 341/144 |
| 7,796,073 B2 * | 9/2010 | Ogawa et al. | .................. | 341/144 |

OTHER PUBLICATIONS

IEEE International Solid-State Circuits Conference, Session 6; P. Schvan et al.; "High-Speed and Oversampled DACs; A 22GS/s 6b DAC with Integrated Digital Ramp Generator"; pp. 122-123,588; 2005.

* cited by examiner

*Primary Examiner* — Linh V Nguyen
(74) *Attorney, Agent, or Firm* — Ware, Fressola, Van Der Sluys & Adolphson, LLP

(57) ABSTRACT

A parallel digital-analog converter for the conversion of a plurality of differential digital input signals into a differential analog output signal, including a group of 1-bit digital-analog converters (200) which respectively include an intermediate storage cell (202) and a current cell (201) and which are adapted to feed a respective output current to a first (204) or a second output contact (206) in dependence on a logic state of the intermediate storage cell, wherein a first of two outputs of an intermediate storage cell (202) is connected by way of an input resistor (220) to a first signal terminal (208.1) of a first transistor (208) and a second of the two outputs of the intermediate storage cell (202) is connected by way of an input resistor (218) to a first signal terminal (210.1) of a second transistor (210), the respective first signal terminals of the first and second transistors are additionally connected by way of a constant current source (212 and 214) to a ground terminal (216), and wherein a respective time-constant bias voltage is applied at a respective control terminal (208.2 and 210.2) of the first and second transistors.

7 Claims, 3 Drawing Sheets

-Prior Art-

DIGITAL-ANALOG CONVERTER

CROSS REFERENCE TO RELATED APPLICATION

Reference is made to and priority claimed from German Patent Application Serial No. DE 10 2008 50 001.1, filed Sep. 30, 2008, entitled DIGITAL-ANALOG-UMSETZER.

BACKGROUND OF THE INVENTION

1. Technical Field

The present invention concerns a parallel digital-analog converter (D/A converter) for the conversion of a plurality of differential digital input signals into a differential analog output signal, including a group of 1-bit digital-analog converters which respectively include an intermediate storage cell and a current cell and which are adapted to feed a respective output current to a first or a second output contact in dependence on a logic state of the intermediate storage cell.

2. Discussion of Related Art

Parallel D/A converters of the above-indicated kind for a high signal bandwidth are usually designed for conversion into an output current. When an output voltage is required, that is generated by passing by way of a resistor with the output current through a resistor. For conversion of an N-bit width input word a parallel D/A converter includes at least N intermediate memory cells and up to $2^N-1$ current cells, but at least N current cells.

A diagrammatic representation of a known parallel D/A converter with N intermediate memory cells and N current cells is shown in FIG. 1.

It has the inputs DN, DP for N differential input signals, a clock signal input CLK and an output QN, QP for a differential output signal. Each intermediate memory cell 102 has two respective input terminals for a differential digital signal and is usually in the form of a clock flank-controlled D-flipflop. Either the voltage $V_{high}$ (high level) or the voltage $V_{low}$ (low level) is at the output Q of the flipflop and the respectively complementary voltage is at the negated output $\overline{Q}$.

The current cell 101 is in the form of what is referred to as a differential stage. Depending on the respective logic state of the intermediate memory cell the differential stage feeds a respective constant current $I_{ref\_0}$ either to the output ICP or the output ICN. The output ICP of a respective current cell is fed to the output node QP and the output ICN of a respective current cell is fed to the output node QN so that the differential analog output signal of the D/A converter can be detected at the output nodes QN and QP.

So that a parallel D/A converter of the above-described kind correctly converts an N-bit width input word into an analog output signal the reference currents $I_{ref\_i}$ of the respective current cells must be weighted corresponding to:

$$I_{ref\_i}=2^i \cdot I_{ref\_0}; (i=1 \ldots N-1). \quad (1)$$

The least significant bit (LSB) of an N-bit width input word thus feeds a current of $I_{ref\_0}$ either to the output node QP or the output node QN and the most significant bit (MSB) feeds a current of $2^{N-1}*I_{ref\_0}$.

That weighting is problematical for two reasons: on the one hand the weighting must be sufficiently precise to ensure accurate conversion of a digital input signal into an analog output signal and on the other hand a high reference current $I_{ref\_i}$ reduces the switching speed of the transistors.

Therefore, for a higher speed, identical values are often used for the currents $I_{ref\_i}$. The D/A converter is then weighted in unary mode instead of binary, and requires $2^N-1$ current cells. A binary input signal of N bits then has to be re-coded by an encoder (not included in FIG. 1) into what is referred to as a thermometer code with $2^N-1$ bits. Frequently a combination of both is used: unary code for the M higher bits of the N bits and binary code for the N-M lower bits. A plurality of current cells are then connected in parallel with an intermediate storage cell.

A disadvantage of that known configuration of parallel D/A converters is that the current cell 101 limits the maximum sample rate of the converter for a given technology. The upper limit of the maximum sample rate is specified in the publication "A 22 GS/s 6b DAC with integrated digital ramp generator" by Peter Schvan, Daniel Pollex and Thomas Bellingrath, IEEE ISSCC 2006, Vol 49, pages 572-573, for the current 130 nm-SiGe-BiCMOS technology with about 22 giga samples/second (GS/s). The known parallel D/A converters can thus be only limitedly used for processing signals in optical fiber systems.

Therefore the technical object of the invention is to propose a parallel digital-analog converter of the kind set forth in the opening part of this specification, which with sufficient accuracy has a very high sample rate, in particular over 22 GS/s.

DISCLOSURE OF INVENTION

That technical object is attained for a digital-analog converter of the kind set forth in the opening part of this specification in that a first of two outputs of an intermediate storage cell is connected by way of an input resistor to a first signal terminal of a first transistor and a second of the two outputs of the intermediate storage cell is connected by way of an input resistor to a first signal terminal of a second transistor.

In addition the respective first signal terminals of the first and second transistors are additionally connected by way of a constant current source to a ground terminal.

Finally a respective time-constant bias voltage is applied at a respective control terminal of the first and second transistors.

The invention is based on the consideration that the disadvantage of the known circuit of FIG. 1 is accounted for, as follows: depending on the respective logic state of the D-flipflop 102 one transistor is switched on and the other is switched off. Either the transistor MP or the transistor MN carries a large part of the reference current $I_{ref\_0}$. The respective other transistor carries a remaining residual current which, as it worsens the accuracy of the parallel A/D converter, is also referred to as a fault current. To minimize the fault current the voltage level difference between the base terminals of the two transistors must be relatively great; in other words the difference in respect of high level and low level of the D-flipflop must be great. That however increases the time required for switching over the differential stage and for building up the output current. Thus with a sufficient level of accuracy the maximum sample rate of the A/D converter is subject to an upper limit.

The circuit for a respective current cell of the D/A converter according to the invention forms a double cascade circuit instead of a differential stage. The advantage achieved with the invention is in particular that the transistors are continuously supplied with current by virtue of the constant current sources and the bias voltage. To output a differential output current, in contrast to the transistors of the known D/A converter, they do not have to be transferred completely from a switched-on state into a switched-off state (or vice-versa). That is an essential reason why switching-over of the cascade circuit of the D/A converter according to the invention is faster than that of the differential stage of the known D/A converter.

A further advantage of the invention is that the use of a cascade circuit, by virtue of its per se known action of eliminating the Miller effect, makes it possible for the A/D converter according to the invention to be overall of a substantially greater bandwidth than a known A/D converter which uses a differential stage.

Thus the parallel D/A converter according to the invention can sample input signals with a sufficient accuracy at a rate of far above 22 GS/s, for example a rate of 50 GS/s.

Embodiments by way of example of the invention are described hereinafter. The additional features of the embodiments can be combined together to form additional embodiments insofar as they are not described as alternatives to each other.

It will be appreciated that the transistors of the D/A converter according to the invention can be both bipolar transistors and also field effect transistors. Both transistor types provide the same advantages in principle for the D/A converter in the circuitry according to the invention. The first signal terminal is then the emitter or source terminal, the second signal terminal is the collector or drain terminal and the control terminal is the base or gate terminal respectively.

In a further embodiment of the D/A converter according to the invention the two input resistors of a respective current cell are of an identical magnitude which can be freely selected. That has the advantage that precise weighting of the reference current of a respective current cell can be effected by the dimensioning of the input resistor.

Desirably the two constant current sources of a respective current cell generate currents which are identical in magnitude. Thus no additional differential current which would worsen the accuracy of the D/A converter is superimposed on the output current of a respective current cell.

In further embodiments of the D/A converter according to the invention the bias voltages of the two transistors, which are constant in time, are of an identical magnitude which can be freely selected. Fixing a bias voltage which is constant in respect of time provides for operating point setting of the transistors which desirably operate at the same point.

Preferably the respective current cells include two additional amplifier transistors, wherein the first output of the intermediate storage cell is connected to a control terminal of a first amplifier transistor and the second output of the intermediate storage cell is connected to a control terminal of a second amplifier transistor and a first signal terminal of the first amplifier transistor is connected by way of a resistor to a first signal terminal of the first transistor and a first signal terminal of the second amplifier transistor is connected by way of a resistor to a first signal terminal of the second transistor.

That has the advantage that the input source has only a low loading even in the parallel connection of many current cells.

BRIEF DESCRIPTION OF THE DRAWINGS

Further advantages of the invention are described in the description hereinafter with reference to the drawing in which.

DETAILED DESCRIPTION

Figure 1:
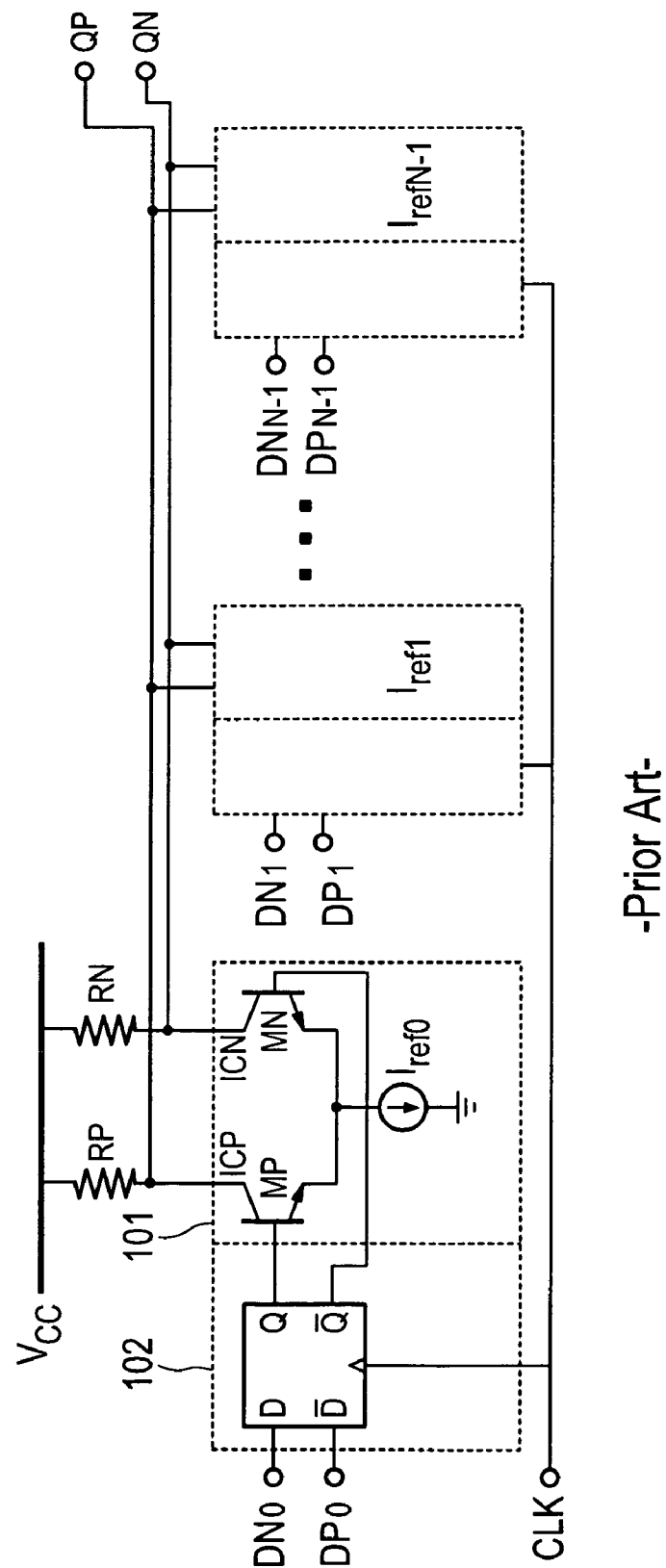
FIG. 1 shows a diagrammatic view of a known circuit for a parallel D/A converter.
Figure 2:
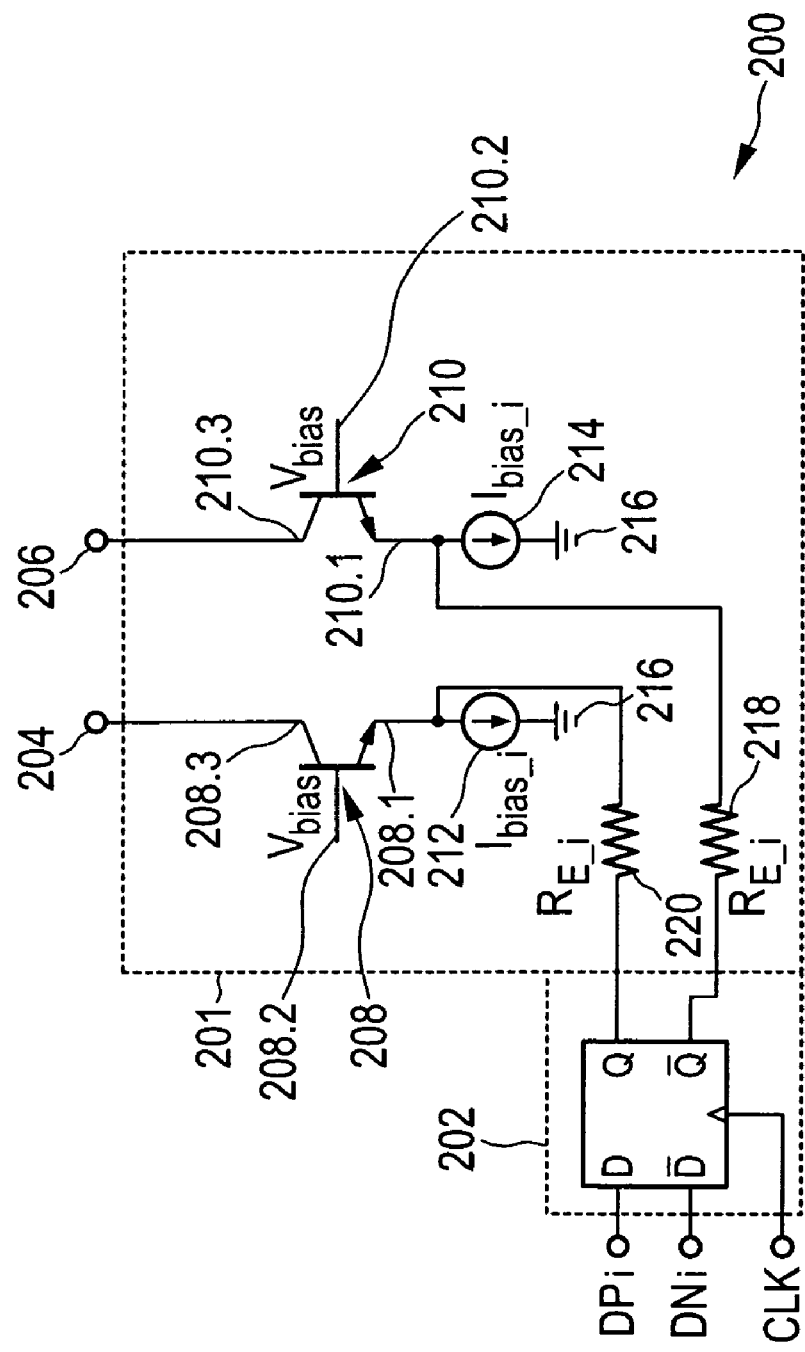
FIG. 2 shows a circuit of a current cell of the parallel D/A converter according to the invention.

FIG. 2 shows the circuit of a current cell of a parallel D/A converter according to the invention. The circuit has the inputs DPi and DNi, at which a differential input signal is applied, the input CLK by way of which a clock signal is fed to the clock flank-controlled intermediate storage means 202, here in the form of a D-flipflop, and the outputs 204 and 206, at which an output current is outputted.

According to the input signal, either a voltage $V_{high}$ (high level) or a voltage $V_{low}$ (low level) occurs at the output Q of the D-flipflop and the respective complementary voltage occurs at the negated output $\overline{Q}$ of the D-flipflop. The output Q of the flipflop 202 is connected by way of a resistor 220 to a first signal terminal 208.1 of the first transistor 208 and the negated output $\overline{Q}$ of the flipflop 202 is connected by way of a resistor 218 to a first signal terminal 210.1 of the second transistor 210.

The two transistors 208 and 210 are in the form of bipolar transistors in FIG. 2. The emitter terminal 208.1 in the form of a first signal terminal of the transistor 208 in accordance with the claims is connected by way of the constant current source 212 to a ground terminal 216 and the emitter terminal 210.1 as the first signal terminal of the transistor 210 is connected by way of the constant current source 214 to a ground terminal 216. Both current sources generate a current $I_{bias\_i}$ which is identical in magnitude and direction. The voltage $V_{bias}$ which is constant in respect of time is applied to the base terminals 208.2 and 210.2 forming the control terminals of the two transistors. The collector terminal 208.3 is fed directly to the output 204 and the collector terminal 210.3 is fed directly to the output 206.

The magnitude of the bias voltage $V_{bias}$ which is constant in respect of time can basically be freely selected. In the present example it is so selected that the potential $V_{208.1}$ and $V_{210.1}$ at the respective emitter terminals 208.1 and 210.1 is in the center between the high level and the low level of the flipflop, that is to say:

$$V_{208.1} = V_{210.1} = V_{low} + \frac{V_{high} - V_{low}}{2} \quad (2)$$

With such a selected time-constant bias voltage $V_{bias}$, what flows in the resistor 220, according to the logic state of the flipflop, is either half a reference current of $$\frac{1}{2} \cdot I_{ref\_i} = \frac{V_{208.1} - V_{high}}{R_{E\_i}} = \frac{1}{2} \cdot \frac{V_{low} - V_{high}}{R_{E\_i}}; \quad (3)$$

(high level at the output Q) or $$\frac{1}{2} \cdot I_{ref\_i} = \frac{V_{208.1} - V_{low}}{R_{E\_i}} = \frac{1}{2} \cdot \frac{V_{high} - V_{low}}{R_{E\_i}}; \quad (4)$$

(low level at the output Q)

The respectively complementary current flows in the resistor 218.

Accordingly the differential current upon a change in the state of the flipflop at an output 204 or 206 is just $I_{ref\_i}$ and $-I_{ref\_i}$ respectively. If $V_{bias}$ is so selected that equation 2 does not apply, the overall current at an output admittedly changes, but not the differential current which is relevant for evaluation, upon a change in the state of the flip-flop.

Weighting of the output currents $I_{ref\_i}$ of the respective current cells can be effected by the dimensioning of $R_{E\_i}$. A further possible way of weighting the output currents is to vary the difference between the high level and the low level of the flipflop. That has the advantage that that difference can also be altered during the transit time of the D/A converter. That function is highly useful in calibration of the D/A converter.

Figure 3:
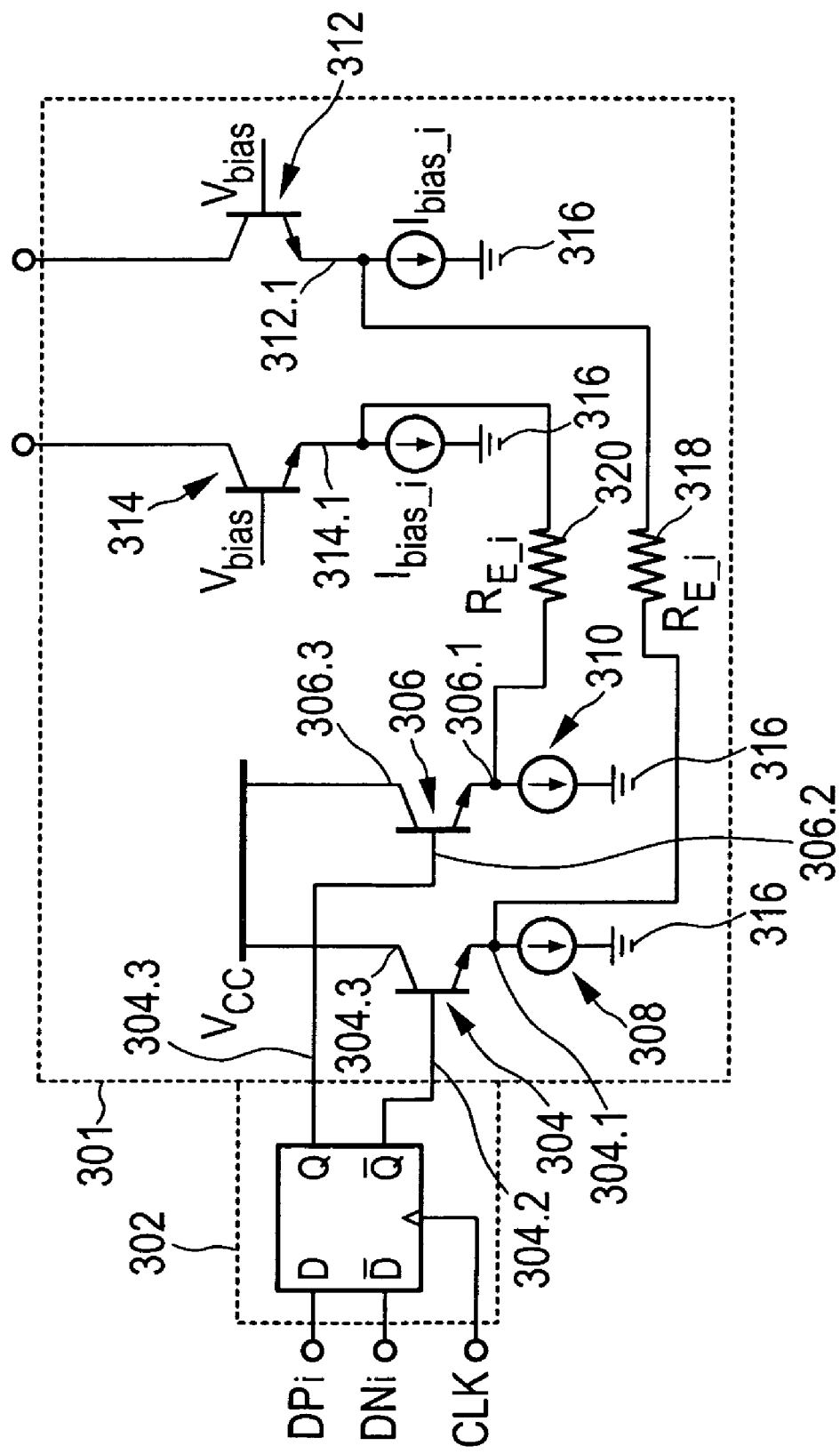
FIG. 3 shows a preferred circuit of a current cell of the parallel D/A converter according to the invention.

FIG. 3 shows a preferred circuit of a current cell of the parallel D/A converter according to the invention. Unlike the example in FIG. 2 the outputs Q and $\overline{Q}$ of the flipflop 302 are now not connected directly by way of a low-ohmic resistor $R_{E\_i}$; to the emitter terminals 312.1 and 314.1, but the output Q is firstly connected to a high-ohmic base terminal 304.2 of a first amplifier transistor 304 and the output $\overline{Q}$ to a high-ohmic base terminal 306.2 of a second amplifier transistor 306. The collector terminals 304.3 and 306.3 are respectively connected directly to the supply voltage Vcc. To improve common-mode suppression the emitter terminal is connected by way of the current source 308 to a ground terminal 316 and the emitter terminal 306.1 is connected by way of the current source 310 to a ground terminal 316. The two current sources 308 and 310 generate currents which are identical in magnitude and direction.

The potential of a respective emitter terminal of the amplifier transistors 304 and 306 follows the potential of the base terminal. The man skilled in the art therefore also refers to emitter followers in the above-described circuitry of the amplifier transistors. The emitter terminal 304.1 is connected by way of the resistor 318 to the emitter terminal 312.1 of the transistor 312 and the emitter terminal 306.1 is connected by way of the resistor 320 to the emitter terminal 314.1 of the transistor 314.

In comparison with the FIG. 2 circuit the present circuit also has the advantage that an input source involves only a low loading even with a parallel connection of a large number of current cells, by virtue of the high-ohmic input.

What is claimed is:

1. A parallel digital-analog converter for the conversion of a plurality of differential digital input signals into a differential analog output signal, including a group of 1-bit digital-analog converters (200) which respectively include an intermediate storage cell (202) and a current cell (201) and which are adapted to feed a respective output current to a first (204) or a second output contact (206) in dependence on a logic state of the intermediate storage cell, characterized in that a first of two outputs of the intermediate storage cell (202) is connected by way of an input resistor (220) to a first signal terminal (208.1) of a first transistor (208) and a second of the two outputs of the intermediate storage cell (202) is connected by way of an input resistor (218) to a first signal terminal (210.1) of a second transistor (210);

the respective first signal terminals of the first and second transistors are additionally connected by way of a constant current source (212 and 214) to a ground terminal (216); and a respective time-constant bias voltage is applied at a respective control terminal (208.2 and 210.2) of the first and second transistors.

2. The parallel digital-analog converter as set forth in claim 1 in which the transistors are bipolar transistors.

3. The parallel digital-analog converter as set forth in claim 1 in which the transistors are field effect transistors.

4. The parallel digital-analog converter as set forth in claim 1 in which the two input resistors of the respective current cell (201) are of an identical magnitude.

5. The parallel digital-analog converter as set forth in claim 1 in which the two constant current sources (212 and 214) of the respective current cell (201) produce currents identical in magnitude.

6. The parallel digital-analog converter as set forth in claim 1 in which the time-constant bias voltages of the two transistors are of an identical magnitude.

7. The parallel digital-analog converter as set forth in claim 1 in which the respective current cells include two additional amplifier transistors (304 and 306), wherein the first output of the intermediate storage cell (302) is connected to a control terminal (306.2) of a first amplifier transistor (306) and the second output of the intermediate storage cell (302) is connected to a control terminal (304.2) of a second amplifier transistor (304); and a first signal terminal (306.1) of the first amplifier transistor (306) is connected by way of a resistor (320) to a first signal terminal (314.1) of the first transistor (314) and a first signal terminal (304.1) of the second amplifier transistor (304) is connected by way of a resistor (318) to a first signal terminal (312.1) of the second transistor (312).

* * * * *